(12) United States Patent
Cheng et al.

(10) Patent No.: US 11,296,500 B2
(45) Date of Patent: *Apr. 5, 2022

(54) OUTPUT CIRCUIT WITH ESD PROTECTION

(71) Applicant: NOVATEK Microelectronics Corp., Hsin-Chu (TW)

(72) Inventors: Jhih-Siou Cheng, New Taipei (TW); Ju-Lin Huang, Hsinchu County (TW); Chia-En Wu, New Taipei (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 136 days.

This patent is subject to a terminal disclaimer.

(21) Appl. No.: 16/821,947

(22) Filed: Mar. 17, 2020

(65) Prior Publication Data
US 2020/0220350 A1 Jul. 9, 2020

Related U.S. Application Data

(63) Continuation of application No. 15/378,067, filed on Dec. 14, 2016, now Pat. No. 10,637,235.

(60) Provisional application No. 62/331,408, filed on May 3, 2016.

(51) Int. Cl.
*H02H 9/04* (2006.01)
*H01L 27/02* (2006.01)

(52) U.S. Cl.
CPC ......... *H02H 9/046* (2013.01); *H01L 27/0266* (2013.01); *H01L 27/0288* (2013.01)

(58) Field of Classification Search
CPC .. H92H 9/046; H01L 27/0266; H01L 27/0288
See application file for complete search history.

(56) References Cited

U.S. PATENT DOCUMENTS

| | | | |
|---|---|---|---|
| 6,437,407 | B1 | 8/2002 | Ker |
| 7,208,993 | B2 | 4/2007 | Torres |
| 7,210,845 | B2 | 5/2007 | Oesch |
| 2002/0110034 | A1 | 8/2002 | Song |
| 2005/0152082 | A1 | 7/2005 | Lee |
| 2008/0073721 | A1 | 3/2008 | Fuchigami |

(Continued)

FOREIGN PATENT DOCUMENTS

| | | |
|---|---|---|
| TW | 441073 | 6/2001 |
| TW | 200908496 | 2/2009 |

(Continued)

*Primary Examiner* — Scott Bauer
(74) *Attorney, Agent, or Firm* — Winston Hsu

(57) ABSTRACT

The present invention provides an output circuit with electrostatic discharge (ESD) protection in a semiconductor chip of a source driver. The source driver is configured to drive a display panel. The output circuit includes an output buffer, an output pad, a switch and a first resistor. The switch is coupled between the output buffer and the output pad, wherein data voltages for driving the display panel are transmitted from the output buffer to the output pad via the switch. The switch includes a first metal oxide semiconductor (MOS) transistor, which includes a first terminal coupled to the output pad, a bulk terminal and a gate terminal. The first resistor is coupled between the bulk terminal of the first MOS transistor and a first power supply terminal.

22 Claims, 14 Drawing Sheets

(56) References Cited

U.S. PATENT DOCUMENTS

| | | | |
|---|---|---|---|
| 2008/0316660 A1* | 12/2008 | Huang | H02H 9/046 361/56 |
| 2011/0148893 A1* | 6/2011 | An | G09G 3/3614 345/545 |
| 2013/0027824 A1 | 1/2013 | Hayano | |
| 2014/0362482 A1 | 12/2014 | Huang | |
| 2015/0084846 A1* | 3/2015 | Suzuki | G09G 3/3655 345/87 |

FOREIGN PATENT DOCUMENTS

| | | |
|---|---|---|
| TW | 201019461 A1 | 5/2010 |
| TW | 201025549 A1 | 7/2010 |

\* cited by examiner

OUTPUT CIRCUIT WITH ESD PROTECTION

CROSS REFERENCE TO RELATED APPLICATIONS

This application is a continuation application of U.S. application Ser. No. 15/378,067, filed on Dec. 14, 2016, which claims the benefit of U.S. Provisional Application No. 62/331,408, filed on May 3, 2016. The contents of these applications are incorporated herein by reference.

BACKGROUND OF THE INVENTION

1. Field of the Invention

The present invention relates to an output circuit of a semiconductor chip, and more particularly, to an output circuit with electrostatic discharge (ESD) protection functions used in a semiconductor chip.

2. Description of the Prior Art

With advancement in semiconductor process technology, the dimension of circuit elements shrinks to a submicron level, which increases performance and operation speed of semiconductor chips. Reliability issues also become significant with decreasing element dimensions. Among these issues, electrostatic discharge (ESD) is one of the most important issues to be dealt with. Since the circuit elements in advanced processes have smaller dimensions, the ESD tolerance capability of the circuit elements becomes worse, while the quantity of environmental static electricity still remains. Therefore, the circuit elements may be damaged by ESD more easily.

In order to solve the ESD problems on an output terminal of a semiconductor chip, a current limiting resistor may be disposed on an output path of signals and connected to the output terminal in serial. If an ESD stress arrives, the resistor may block ESD current or reduce the magnitude of ESD current entering internal circuitry of the semiconductor chip. However, under normal operations of the semiconductor chip, output signals passing through the resistor generate heat energies and raise the operating temperature of the semiconductor chip. Thus, there is a need for improvement over the prior art.

SUMMARY OF THE INVENTION

It is therefore an objective of the present invention to provide an output circuit used for a semiconductor chip, where the output circuit provides electrostatic discharge (ESD) protection function while preventing heat energies from raising the operating temperature in normal operations of the semiconductor chip.

An embodiment of the present invention discloses an output circuit with ESD protection in a semiconductor chip of a source driver. The source driver is configured to drive a display panel. The output circuit comprises an output buffer, an output pad, a switch and a first resistor. The switch is coupled between the output buffer and the output pad, wherein data voltages for driving the display panel are transmitted from the output buffer to the output pad via the switch. The switch comprises a first metal oxide semiconductor (MOS) transistor, which comprises a first terminal coupled to the output pad, a bulk terminal and a gate terminal. The first resistor is coupled between the bulk terminal of the first MOS transistor and a first power supply terminal.

Another embodiment of the present invention discloses an output circuit with ESD protection in a semiconductor chip. The output circuit comprises an output buffer and a first resistor. The output buffer is coupled to an output pad of the semiconductor chip. The output buffer comprises a first MOS transistor and a second MOS transistor. The first MOS transistor comprises a first terminal coupled to the output pad, a bulk terminal and a gate terminal. The second MOS transistor comprises a first terminal coupled to the output pad, a bulk terminal and a gate terminal. The first resistor is coupled between the bulk terminal of the first MOS transistor and a first power supply terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
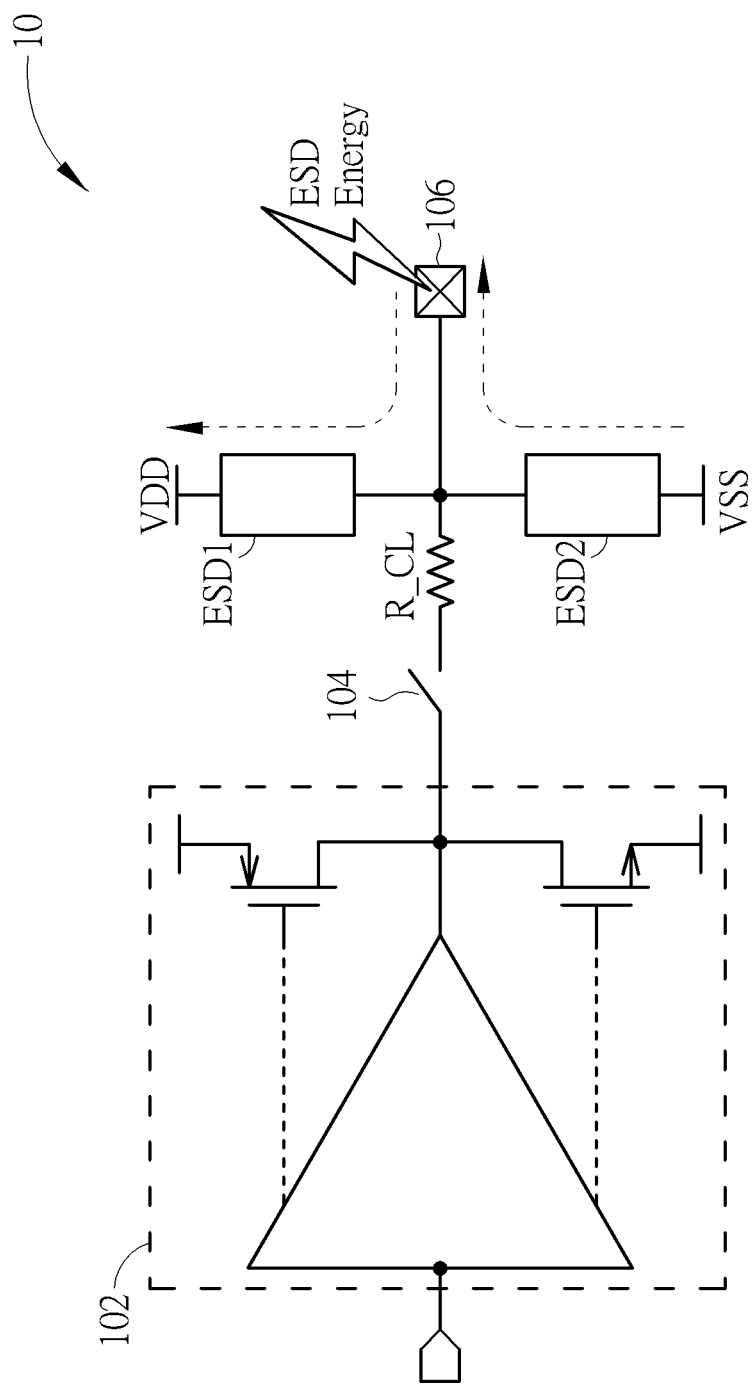
FIGS. 1A and 1B are schematic diagrams of a general structure of an output circuit in a semiconductor chip.
Figure 1B:
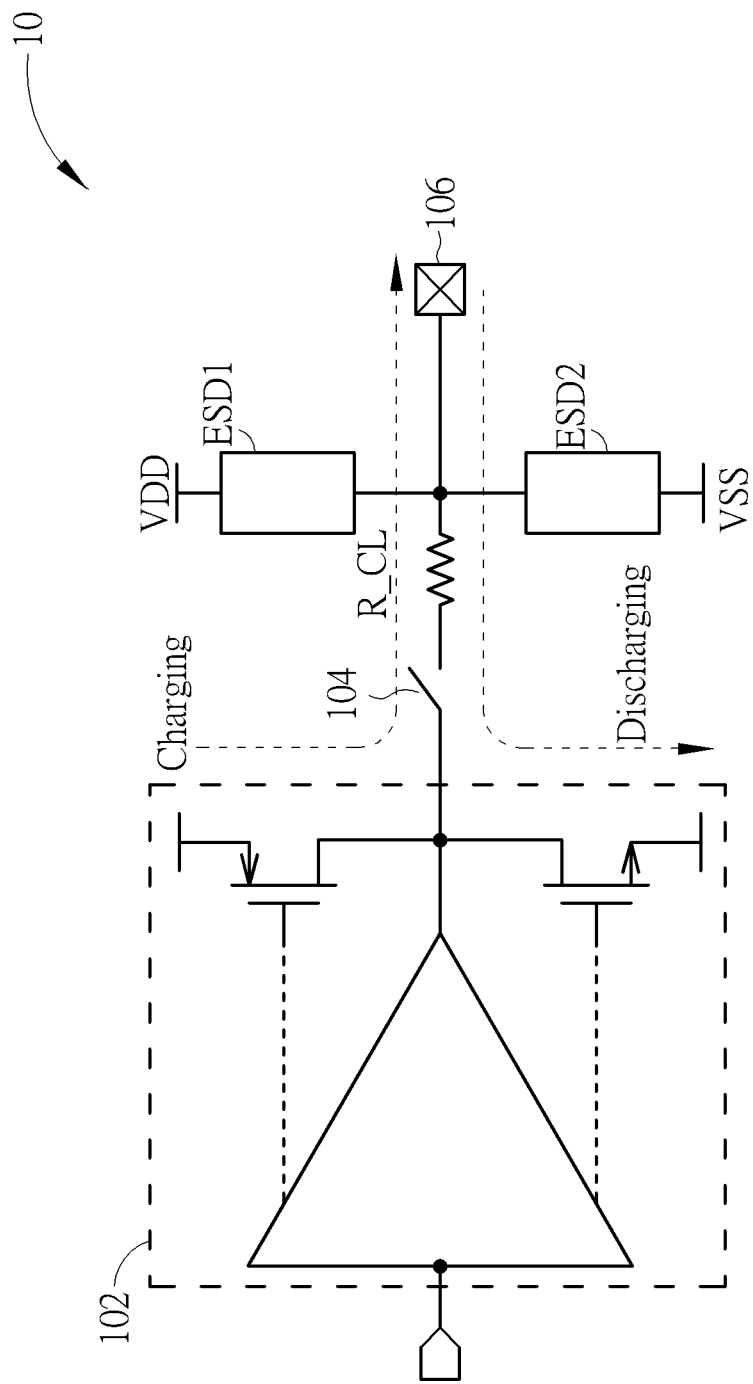

Please refer to FIGS. 1A and 1B, which are schematic diagrams of a general structure of an output circuit 10 in a semiconductor chip. The output circuit 10 includes an output buffer 102, a switch 104, an output pad 106 and a current limiting resistor R_CL. Electrostatic discharge (ESD) protection units ESD1 and ESD2, which may not be included in the output circuit 10, are shown in FIGS. 1A and 1B for illustrating the flowing paths of ESD currents or charges. The output circuit 10 may be used in a driver integrated circuit (IC) of a panel, for outputting data voltages to the panel. The output buffer 102 may be an operational amplifier. The data voltages are outputted via the switch 104 to the output pad 106. The switch 104 may control the output path of the data voltages to be closed or open, and may be composed of a transmission gate including a P-type metal oxide semiconductor (PMOS) transistor and an N-type metal oxide semiconductor (NMOS) transistor. The output pad 106 acts as an output interface of the output circuit 10 to be connected with an external component such as the panel. The current limiting resistor R_CL, which is disposed on the output path between the output buffer 102 and the output pad 106, is used for preventing ESD currents from entering the internal circuitry of the semiconductor chip or reducing the magnitude of ESD current entering the internal circuitry. The ESD protection units ESD1 and ESD2, which provide paths for conducting ESD currents, enhance the ESD protection performance of the output circuit 10.

FIG. 1A illustrates an ESD phase, where an ESD stress or ESD energy appears on the output pad 106. With the cooperation of the current limiting resistor R_CL and the ESD protection units ESD1 and ESD2, the ESD currents generated by the ESD stress on the output pad 106 may flow through the ESD protection unit ESD1 to the system power supply terminal VDD or flow through the ESD protection unit ESD2 from the system ground terminal VSS. In such a situation, none or only little ESD currents may flow into the output buffer 102, and the circuit components inside the semiconductor chip are protected by the current limiting resistor R_CL.

FIG. 1B illustrates a normal operation of the semiconductor chip, where the output circuit 10 outputs data voltages via the output pad 106. For example, if the output circuit 10 is used in a source driver for outputting data voltages, a charging current may flow to the output pad 106 from the output buffer 102 if a current data voltage is higher than a previous data voltage, and a discharging current may flow to the output buffer 102 from the output pad 106 if a current data voltage is lower than a previous data voltage. Both the charging and discharging currents may pass through the current limiting resistor R_CL, which generates a power loss. In such a situation, the driving capability of the output circuit 10 may be reduced due to the power loss on the current limiting resistor R_CL. The power loss may become thermal energy which increases the operating temperature of the semiconductor chip. Since a source driver may include a great number of output circuits such as the output circuit 10, the great number of the current limiting resistors in the output circuits increases the operating temperature significantly.

Figure 2A:
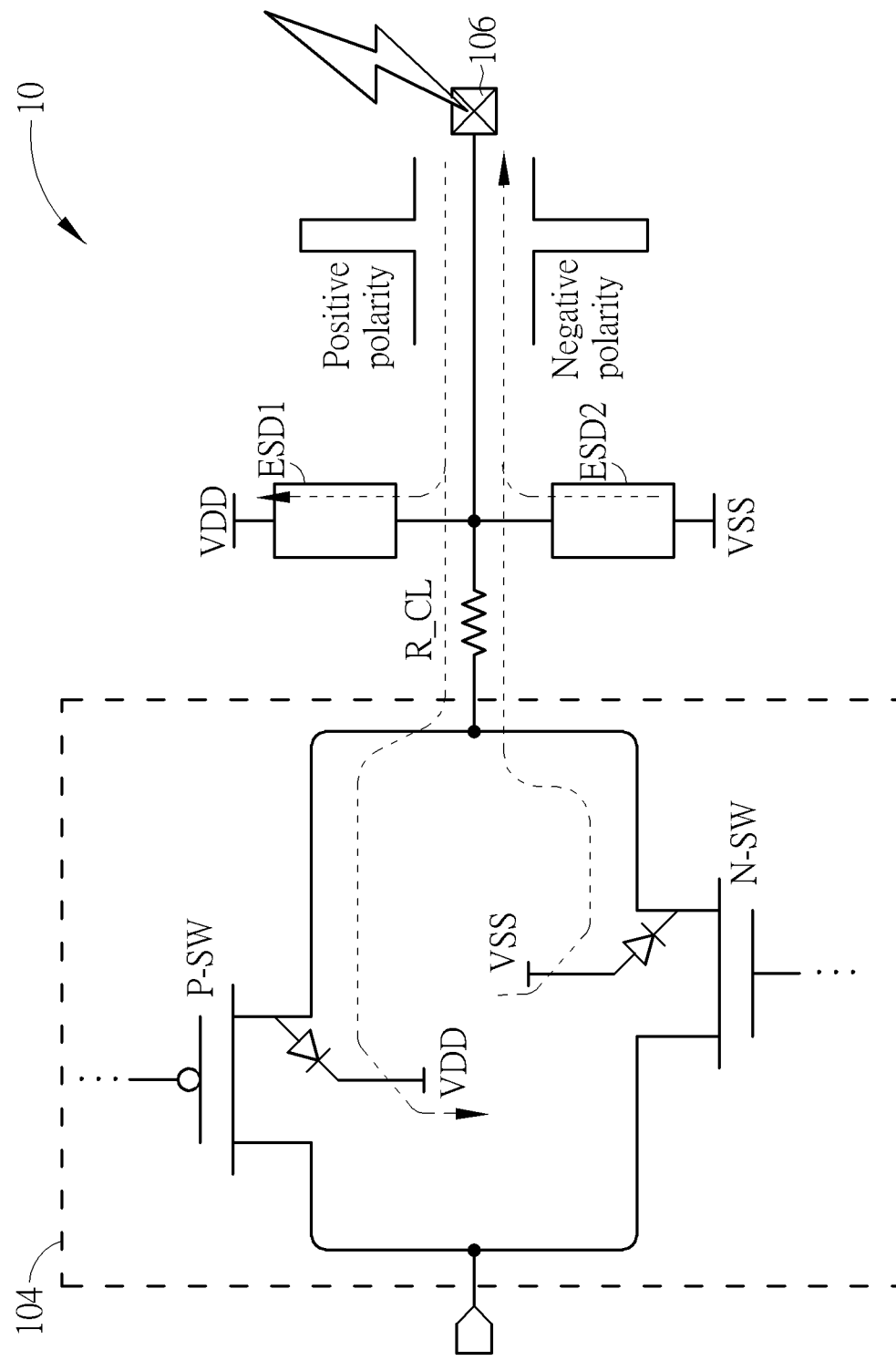
FIGS. 2A and 2B are schematic diagrams of detailed operations of the output circuit shown in FIGS. 1A and 1B.
Figure 2B:
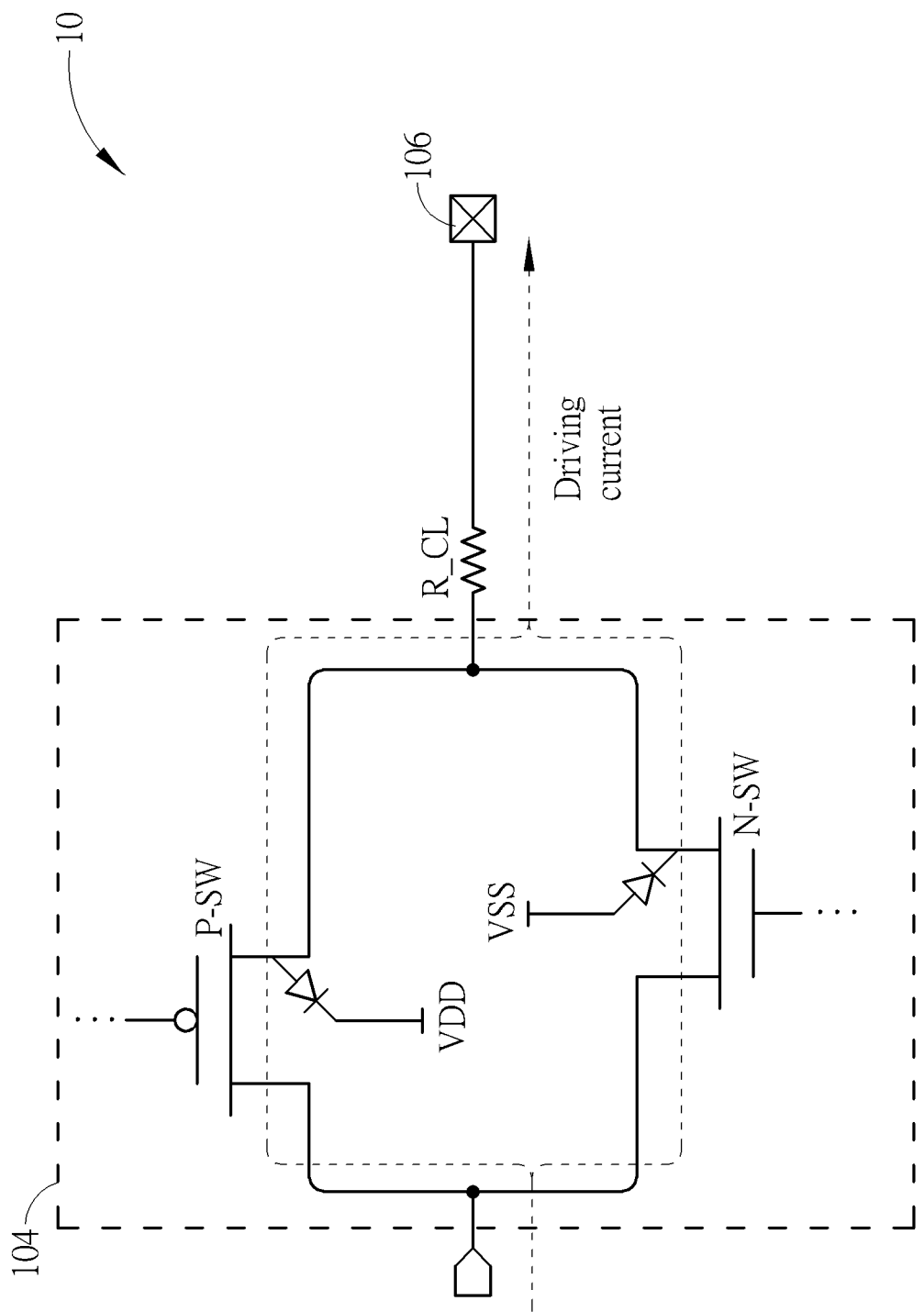

Please refer to FIGS. 2A and 2B, which are schematic diagrams of detailed operations of the output circuit 10 shown in FIGS. 1A and 1B. More specifically, FIG. 2A illustrates current paths in the ESD phase and FIG. 2B illustrates current paths in the normal operation of the semiconductor chip.

In FIG. 2A, only the switch 104, the output pad 106, the current limiting resistor R_CL and the ESD protection units ESD1 and ESD2 are illustrated for simplicity. The switch 104 is composed of a PMOS transistor P-SW and an NMOS transistor N-SW and implemented as a transmission gate. A P-N junction, referred as a diode, exists between a terminal of the PMOS transistor P-SW close to the output pad 106 (which may be the source terminal or the drain terminal of the PMOS transistor P-SW) and the bulk terminal of the PMOS transistor P-SW, and also a P-N junction exists between the bulk terminal of the NMOS transistor N-SW and a terminal of the NMOS transistor N-SW close to the output pad 106 (which may be the source terminal or the drain terminal of the NMOS transistor N-SW). In the ESD phase, an ESD stress of positive polarity (called positive ESD stress hereinafter) applying on the output pad 106 may generate an ESD current flowing from the output pad 106. With the deployment of the current limiting resistor R_CL, much of the ESD current may be conducted to the system power supply terminal VDD via the ESD protection unit ESD1. Only little ESD current may flow through the current limiting resistor R_CL toward the switch 104, and this ESD current is conducted to the system power supply terminal VDD via the P-N junction of the PMOS transistor P-SW. On the other hand, there may be an ESD stress of negative polarity (called negative ESD stress hereinafter) applying on the output pad 106 that generates an ESD current flowing toward the output pad 106. With the deployment of the current limiting resistor R_CL, much of the ESD current may be conducted from the system ground terminal VSS via the ESD protection unit ESD2. Only little ESD current may flow through the current limiting resistor R_CL from the switch 104, and this ESD current is conducted from the system ground terminal VSS via the P-N junction of the NMOS transistor N-SW. In such a situation, the current limiting resistor R_CL limits the ESD current passing through the P-N junctions and prevents the P-N junctions from being burnt or ruined due to the ESD current.

In FIG. 2B, only the switch 104, the output pad 106 and the current limiting resistor R_CL are illustrated for simplicity. Since the output circuit 10 operates normally to output data voltages, the ESD protection units ESD1 and ESD2 are turned off, and are omitted in FIG. 2B without influencing the operations and illustrations of the output circuit 10. As mentioned above, the driving current of the output signal or data may pass through the current limiting resistor R_CL, and thus the operating temperature of the semiconductor chip increases due to the power loss on the current limiting resistor R_CL.

Figure 3A:
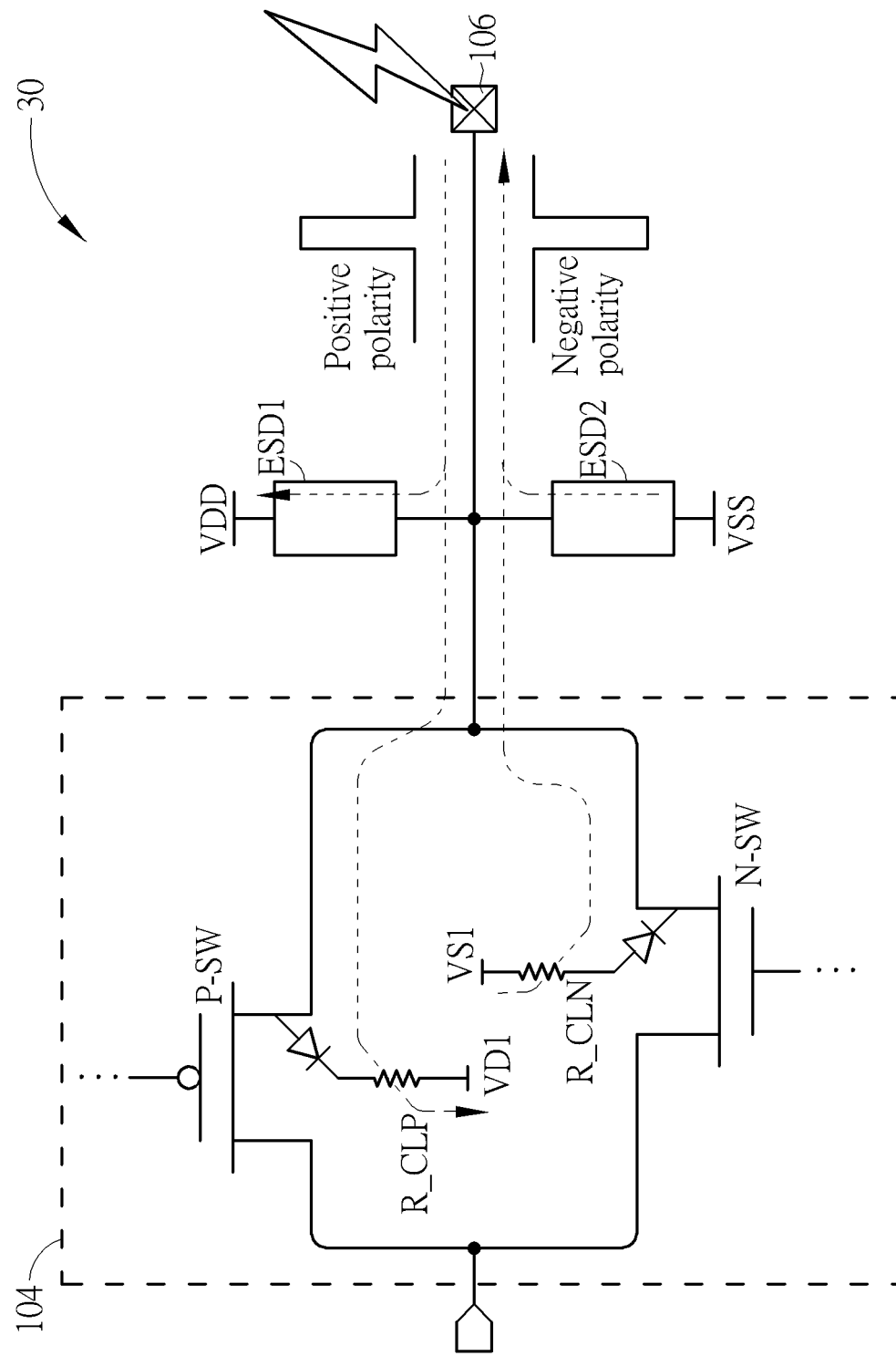
FIGS. 3A and 3B are schematic diagrams of an output circuit according to an embodiment of the present invention.
Figure 3B:
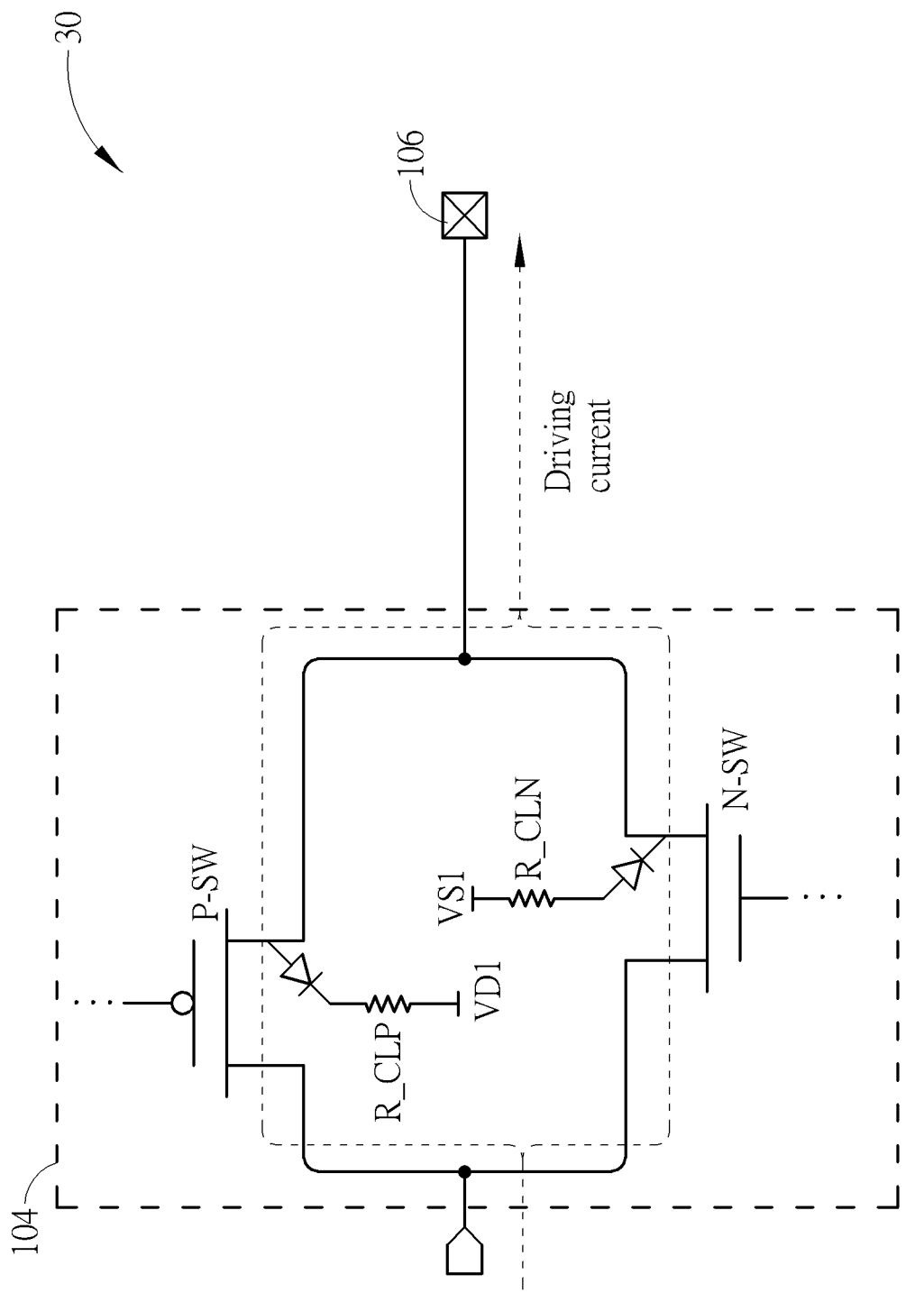

Please refer to FIGS. 3A and 3B, which are schematic diagrams of an output circuit 30 according to an embodiment of the present invention. The structure of the output circuit 30 is similar to the structure of the output circuit 10 shown in FIGS. 2A and 2B, so similar elements or components are denoted by the same symbols. The difference between the output circuit 30 and the output circuit 10 is that, the current limiting resistors R_CLP and R_CLN are disposed in the output circuit 30 to replace the current limiting resistor R_CL on the output path of the output circuit 10.

As shown in FIGS. 3A and 3B, the drain terminal (or source terminal) of the PMOS transistor P-SW is directly coupled to the output pad 106 without passing through any resistor, and the source terminal (or drain terminal) of the NMOS transistor N-SW is directly coupled to the output pad 106 without passing through any resistor. The current limiting resistor R_CLP is coupled to the bulk terminal of the PMOS transistor P-SW, and more specifically, coupled between the bulk terminal of the PMOS transistor P-SW and a power supply terminal VD1. The power supply terminal VD1 may be a system power supply terminal of the semiconductor chip such as the system power supply terminal VDD, or may be any voltage source supplying a voltage level higher than or equal to the source voltage and drain voltage of the PMOS transistor P-SW. The current limiting resistor R_CLN is coupled to the bulk terminal of the NMOS transistor N-SW, and more specifically, coupled between the bulk terminal of the NMOS transistor N-SW and a power supply terminal VS1. The power supply terminal VS1 may be a system ground terminal of the semiconductor chip such as the system ground terminal VSS, or may be any voltage source supplying a voltage level lower than or equal to the source voltage and drain voltage of the NMOS transistor N-SW.

FIG. 3A illustrates current paths in the ESD phase. In an embodiment, a positive ESD stress applying on the output pad 106 may generate an ESD current flowing from the output pad 106. With the deployment of the current limiting resistor R_CLP, much of the ESD current may be conducted to the system power supply terminal VDD via the ESD protection unit ESD1. Only little ESD current may flow through the P-N junction of the PMOS transistor P-SW and the current limiting resistor R_CLP, and this ESD current is conducted to the power supply terminal VD1. In another embodiment, a negative ESD stress applying on the output pad 106 may generate an ESD current flowing toward the output pad 106. With the deployment of the current limiting resistor R_CLN, much of the ESD current may be conducted from the system ground terminal VSS via the ESD protection unit ESD2. Only little ESD current may flow through the P-N junction of the NMOS transistor N-SW and the current limiting resistor R_CLN, and this ESD current is conducted from the power supply terminal VS1.

In such a situation, with the deployment of the current limiting resistor R_CLP, the current flowing through the P-N junction between the drain terminal (or source terminal) and the bulk terminal of the PMOS transistor P-SW under the positive ESD stress applying on the output pad 106 is limited. With the deployment of the current limiting resistor R_CLN, the current flowing through the P-N junction between the source terminal (or drain terminal) and the bulk terminal of the NMOS transistor N-SW under the negative ESD stress applying on the output pad 106 is limited. Therefore, in the ESD phase, the current limiting resistors R_CLP and R_CLN coupled to the bulk terminal may reduce the ESD current passing through the P-N junctions so as to prevent the P-N junctions from being burnt or ruined due to the ESD currents. In other words, the current limiting resistors R_CLP and R_CLN provide ESD protection performance similar to the ESD protection provided by the current limiting resistor R_CL shown in FIG. 2A.

FIG. 3B illustrates current paths in the normal operation of the semiconductor chip. In this embodiment, there is no current limiting resistor on the output path of the driving current. The driving current may not pass through the current limiting resistors R_CLP and R_CLN coupled to the bulk terminals of the PMOS transistor P-SW and the NMOS transistor N-SW, so the driving capability of the output circuit 30 may not be reduced by the current limiting resistors R_CLP and R_CLN. In addition, the operating temperature of the semiconductor chip may not increase since there is no power loss on the current limiting resistors R_CLP and R_CLN in the normal operation.

Figure 4:
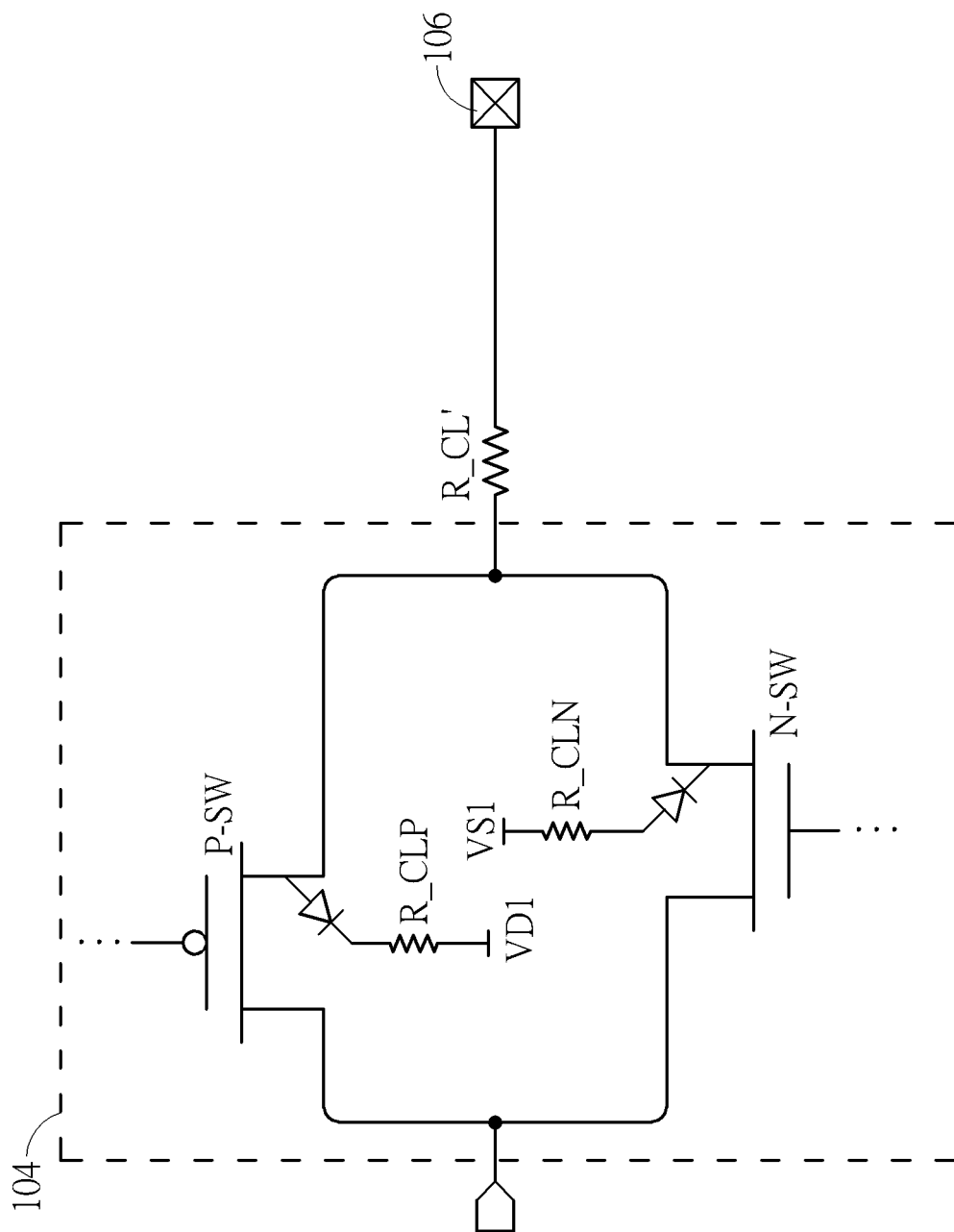
FIG. 4 is a schematic diagram of another output circuit according to an embodiment of the present invention.

Please refer to FIG. 4, which is a schematic diagram of another output circuit 40 according to an embodiment of the present invention. The structure of the output circuit 40 is similar to the structure of the output circuit 30 shown in FIGS. 3A and 3B, so similar elements or components are denoted by the same symbols. The difference between the output circuit 40 and the output circuit 30 is that, in the output circuit 40, an additional current limiting resistor R_CL' is disposed on the output path between the output pad 106 and a terminal of the switch 104 (i.e., the transmission gate) closer to the output pad 106. This terminal of the switch 104 may be regarded as a terminal where the drain terminal (or source terminal) of the PMOS transistor P-SW and the source terminal (or drain terminal) of the NMOS transistor N-SW are coupled. The current limiting resistor R_CL' has a smaller resistance in comparison with the current limiting resistor R_CL on the output path in the output circuit 10 shown in FIGS. 2A and 2B. The additional current limiting resistor R_CL' provides higher ESD protection capability to further reduce the ESD currents entering the P-N junctions of the PMOS transistor P-SW and the NMOS transistor N-SW. Since the resistance of the current limiting resistor R_CL' is smaller than the resistance of the current limiting resistor R_CL applied in the conventional art, heat reduction and higher driving capability may still be achieved due to less power loss on the current limiting resistor R_CL'.

Figure 5:
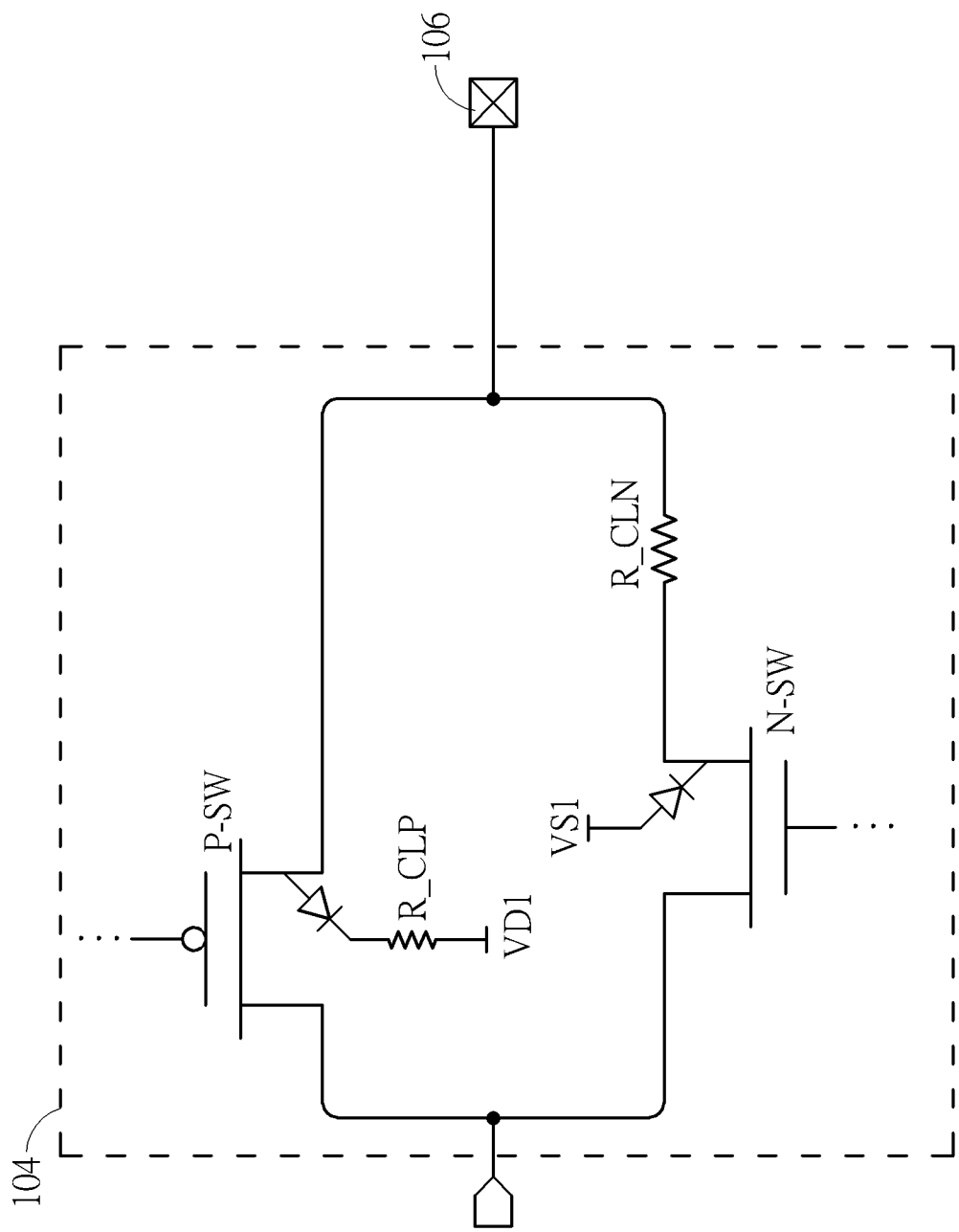
FIG. 5 is a schematic diagram of a further output circuit according to an embodiment of the present invention.

Please refer to FIG. 5, which is a schematic diagram of a further output circuit 50 according to an embodiment of the present invention. The structure of the output circuit 50 is similar to the structure of the output circuit 30 shown in FIGS. 3A and 3B, so similar elements or components are denoted by the same symbols. The difference between the output circuit 50 and the output circuit 30 is that, in the output circuit 50, the current limiting resistor R_CLN is coupled between the output pad 106 and the source terminal (or drain terminal) of the NMOS transistor N-SW rather than coupled to the bulk terminal of the NMOS transistor N-SW. Similarly, the current limiting resistor R_CLN coupled to the output pad 106 may also limit the current flowing through the P-N junction between the source terminal (or drain terminal) and the bulk terminal of the NMOS transistor N-SW under the negative ESD stress applying on the output pad 106. Since the current limiting resistor R_CLP is still coupled to the bulk terminal of the PMOS transistor P-SW, the resistance on the output path of the output circuit 50 is smaller than the resistance of the current limiting resistor R_CL applied in the conventional art; hence, heat reduction and higher driving capability may still be achieved due to less power loss on the output path of the output circuit 50 with the current limiting resistor R_CLN. In another embodiment, the current limiting resistor R_CLP may be coupled to the drain terminal (or source terminal) of the PMOS transistor P-SW while the current limiting resistor R_CLN is coupled to the bulk terminal of the NMOS transistor N-SW.

Please note that the output circuit of the present invention provides an ESD protection scheme which can achieve heat reduction and higher driving capability, where a current limiting resistor is coupled to the bulk terminal of a transistor in the output circuit. Those skilled in the art can make modifications and alternations accordingly. For example, based on the illustrations in FIGS. 3A, 3B, 4 and 5 and related descriptions, the number of current limiting resistors and their deployment may be modified according to system requirements, as long as there is at least one current limiting resistor coupled to the bulk terminal of a transistor coupled to the output pad.

In another embodiment, the ESD protection scheme of the present invention may be applied to another output circuit structure without the transmission gate or switch. Please refer to FIGS. 6A and 6B, which are schematic diagrams of a general structure of an output circuit 60 without a switch. The structure of the output circuit 60 is similar to the structure of the output circuit 10 shown in FIGS. 1A and 1B, so similar elements or components are denoted by the same symbols. The difference between the output circuit 60 and the output circuit 10 is that, there is no switch (i.e., transmission gate) on the output path of the output circuit 60. In such a situation, the output buffer 102 is directly connected to the current limiting resistor R_CL.

Figure 6A:
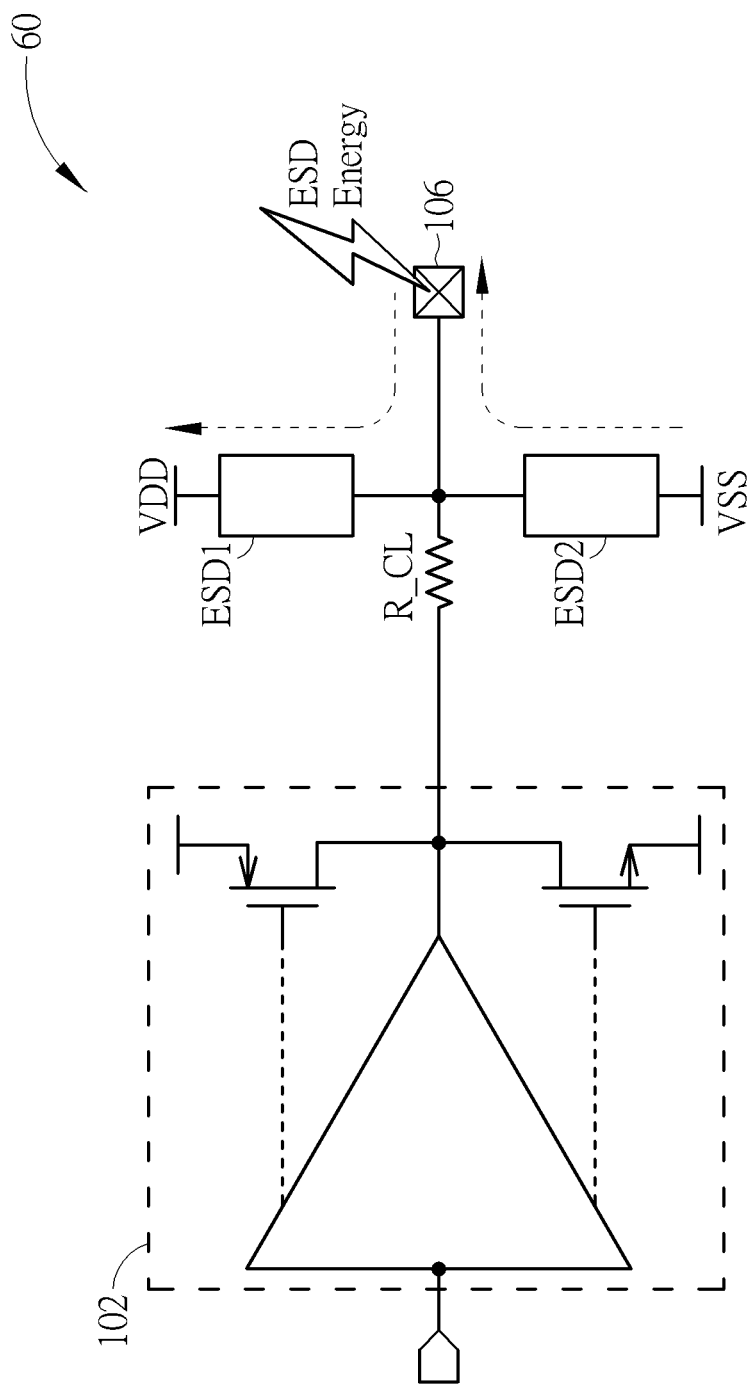
FIGS. 6A and 6B are schematic diagrams of a general structure of an output circuit without a switch.
Figure 6B:
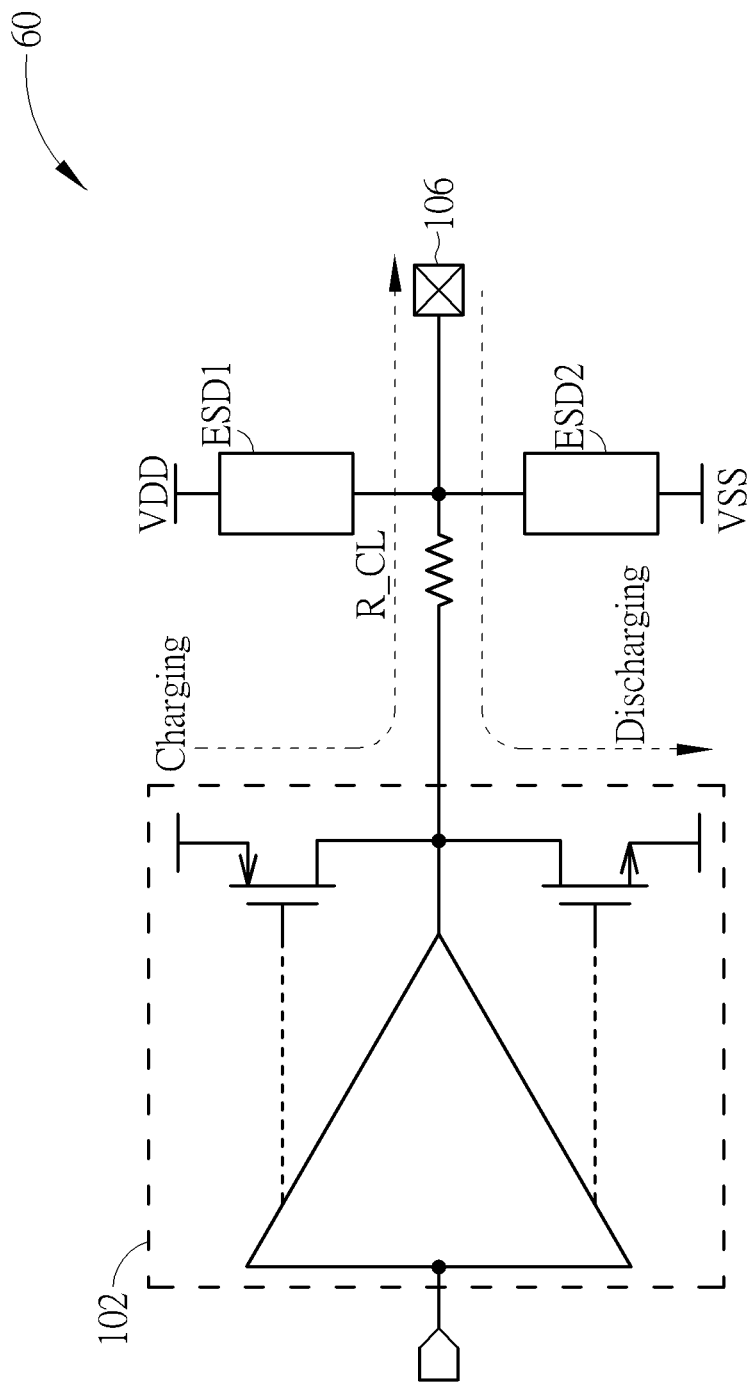

The operations illustrated in FIGS. 6A and 6B are similar to the case shown in FIGS. 1A and 1B. In the ESD phase with ESD energy exerted on the output pad 106 as shown in FIG. 6A, much of the ESD current is conducted to the system power supply terminal VDD via the ESD protection unit ESD1 or conducted from the system ground terminal VSS via the ESD protection unit ESD2. In normal operations of the semiconductor chip as shown in FIG. 6B, the charging and discharging currents may pass through the current limiting resistor R_CL and generate a power loss. In such a situation, the driving capability of the output circuit 60 may be reduced due to the power loss on the current limiting resistor R_CL. The power loss may become thermal energy which increases the operating temperature of the semiconductor chip.

Figure 7A:
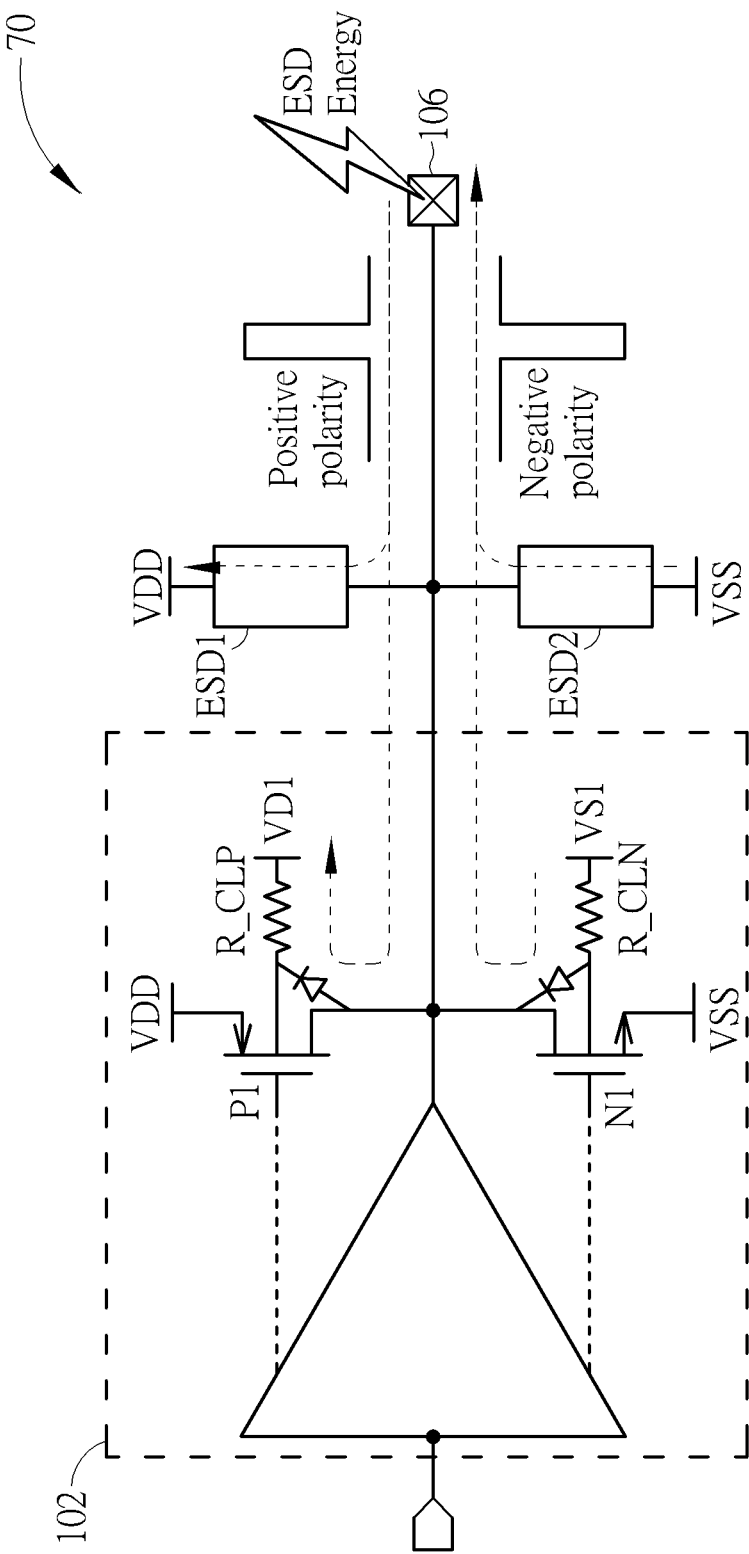
FIGS. 7A and 7B are schematic diagrams of an output circuit according to an embodiment of the present invention.
Figure 7B:
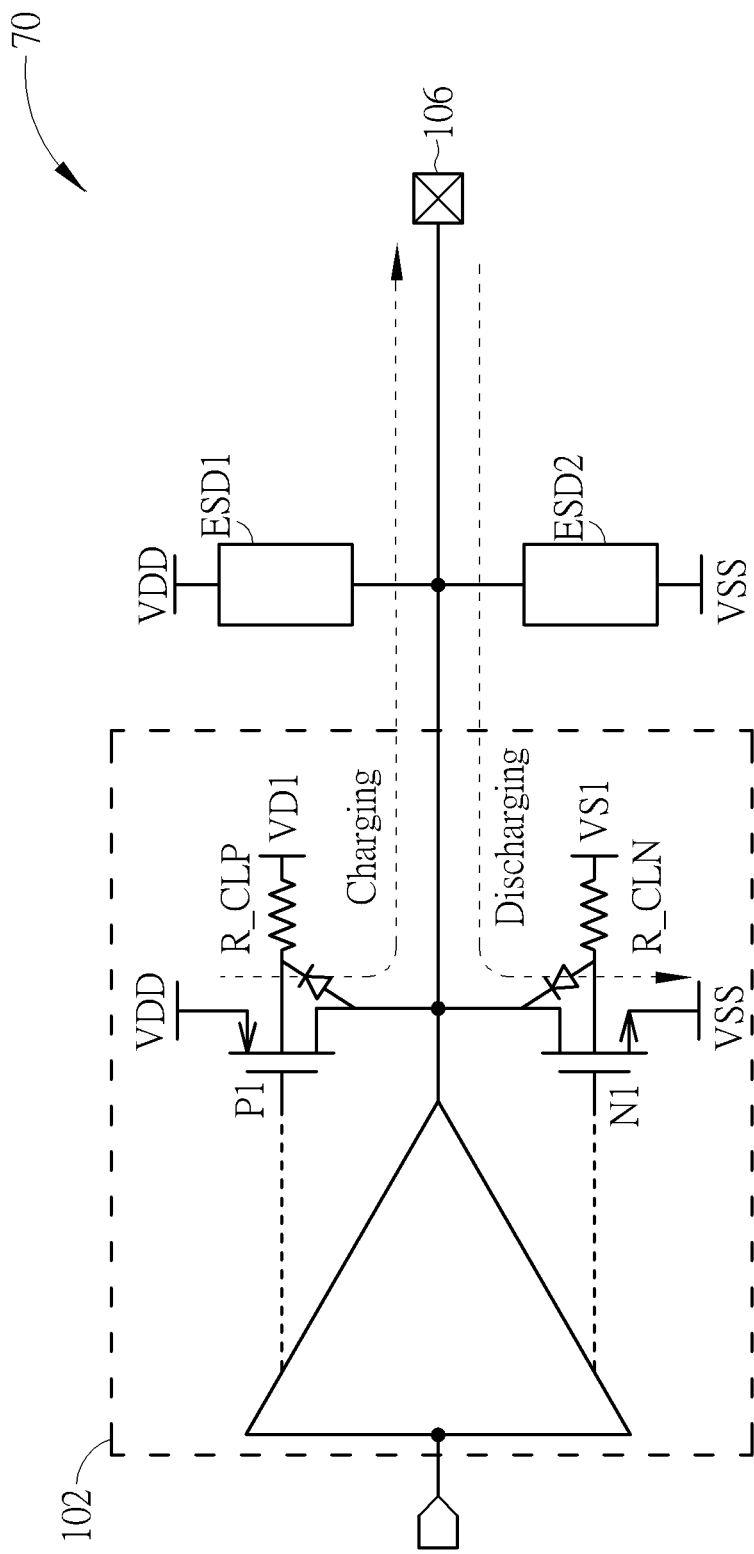

Please refer to FIGS. 7A and 7B, which are schematic diagrams of an output circuit 70 according to an embodiment of the present invention. The structure of the output circuit 70 is similar to the structure of the output circuit 60 shown in FIGS. 6A and 6B, so similar elements or components are denoted by the same symbols. The difference between the output circuit 70 and the output circuit 60 is that, the current limiting resistors R_CLP and R_CLN are disposed in the output circuit 70 to replace the current limiting resistor R_CL on the output path of the output circuit 60.

As shown in FIGS. 7A and 7B, the output stage circuit of the output buffer 102 includes a PMOS transistor P1 and an NMOS transistor N1. The drain terminal of the PMOS transistor P1 and the drain terminal of the NMOS transistor N1 are directly coupled to the output pad 106 without passing through any resistor. The current limiting resistor R_CLP is coupled between the bulk terminal of the PMOS transistor P1 and a power supply terminal VD1. The power supply terminal VD1 may be a system power supply terminal of the semiconductor chip such as the system power supply terminal VDD, or may be any voltage source supplying a voltage level higher than or equal to the source voltage and drain voltage of the PMOS transistor P1. The current limiting resistor R_CLN is coupled between the bulk terminal of the NMOS transistor N1 and a power supply terminal VS1. The power supply terminal VS1 may be a system ground terminal of the semiconductor chip such as the system ground terminal VSS, or may be any voltage source supplying a voltage level lower than or equal to the source voltage and drain voltage of the NMOS transistor N1.

FIG. 7A illustrates current paths in the ESD phase. Under the positive ESD stress applying on the output pad 106, much of the ESD current is conducted to the system power supply terminal VDD via the ESD protection unit ESD1, and only little ESD current flows through the P-N junction of the PMOS transistor P1 and the current limiting resistor R_CLP to the power supply terminal VD1. Under the negative ESD stress applying on the output pad 106, much of the ESD current is conducted from the system ground terminal VSS via the ESD protection unit ESD2, and only little ESD current flows through the P-N junction of the NMOS transistor N1 and the current limiting resistor R_CLN from the power supply terminal VS1. In such a situation, the ESD currents flowing through the P-N junctions of the PMOS transistor P1 and the NMOS transistor N1 under the ESD stress are limited, so as to prevent the P-N junctions from being burnt or ruined due to the ESD currents. FIG. 7B illustrates current paths in the normal operation of the semiconductor chip. The driving current (i.e., the charging current and discharging current) may not pass through the current limiting resistors R_CLP and R_CLN coupled to the bulk terminals of the PMOS transistor P1 and the NMOS transistor N1, so the driving capability of the output circuit 70 may not be reduced by the current limiting resistors R_CLP and R_CLN. In addition, the operating temperature of the semiconductor chip may not increase since there is no power loss on the current limiting resistors R_CLP and R_CLN in the normal operation.

Please note that according to the above illustrations in FIGS. 4 and 5, those skilled in the art should realize that the number of current limiting resistors and their deployment in the output circuit 70 may be modified, in order to meet requirements of driving capability or ESD protection of the semiconductor chip. For example, an additional current limiting resistor having a smaller resistance may be coupled between the output pad 106 and the output buffer 102 of the output circuit 70, in order to provide higher ESD protection capability. In another embodiment, the current limiting resistor R_CLN in the output circuit 70 may be replaced by a current limiting resistor coupled between the drain terminal of the NMOS transistor N1 and the output pad 106, or the current limiting resistor R_CLP in the output circuit 70 may be replaced by a current limiting resistor coupled between the drain terminal of the PMOS transistor P1 and the output pad 106. Those skilled in the art should be able to realize the implementations and operations of different resistor deployments according to the illustrations and descriptions in the above paragraphs; these will not be narrated herein.

Figure 8:
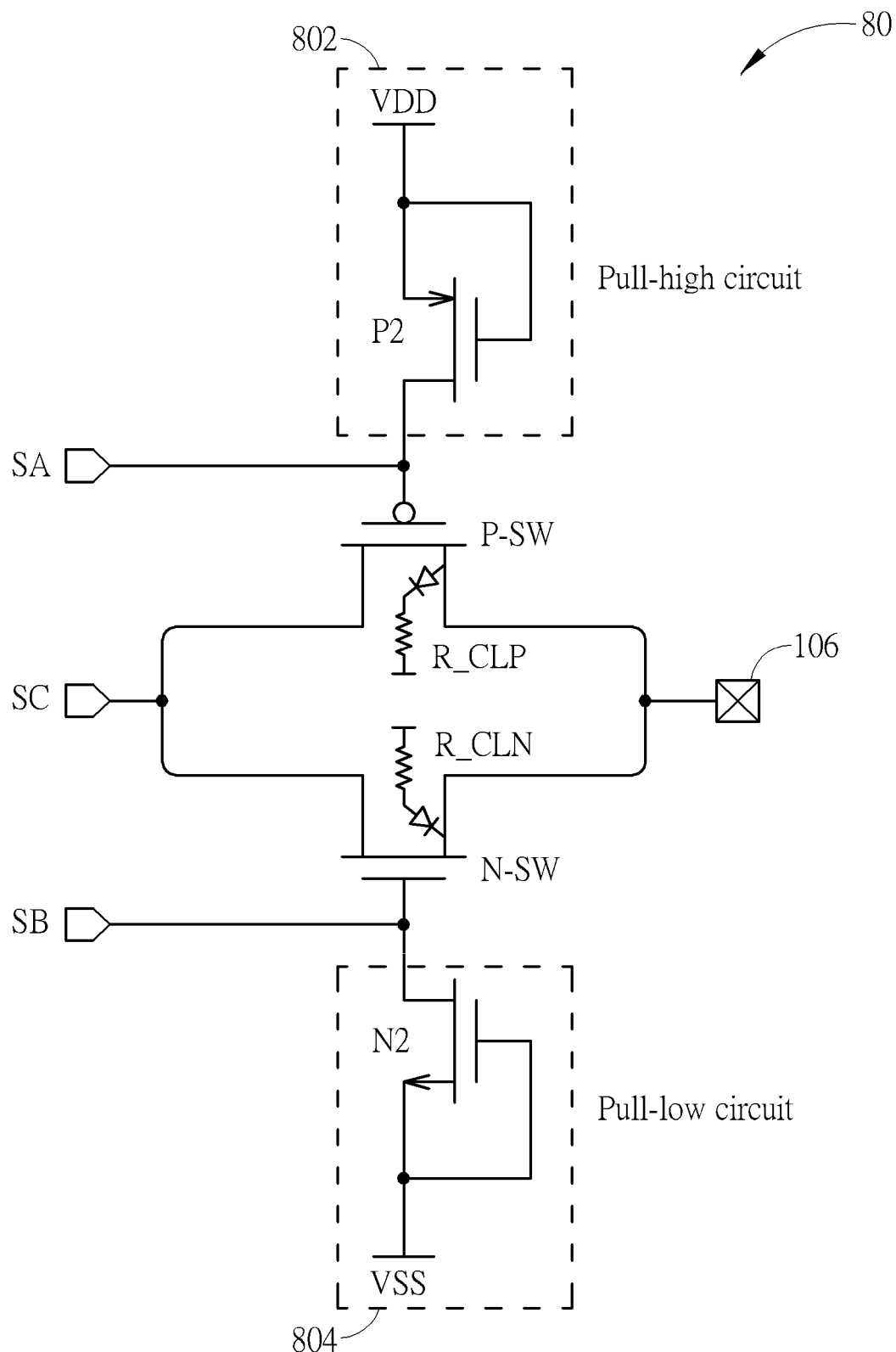
FIG. 8 is a schematic diagram of an output circuit according to an embodiment of the present invention.

Please refer to FIG. 8, which is a schematic diagram of an output circuit 80 according to an embodiment of the present invention. The structure of the output circuit 80 is similar to the structure of the output circuit 30 shown in FIGS. 3A and 3B, so similar elements or components are denoted by the same symbols. The difference between the output circuit 80 and the output circuit 30 is that, the output circuit 80 further includes a pull-high circuit 802 and a pull-low circuit 804. The ESD protection units are omitted in FIG. 8 for simplicity. Signals SA, SB and SC may come from an output buffer, which is not illustrated in FIG. 8 for simplicity.

In detail, the pull-high circuit 802 is coupled to the gate terminal of the PMOS transistor P-SW. The pull-high circuit 802 may be implemented with a PMOS transistor P2, which is coupled between the gate terminal of the PMOS transistor P-SW and the system power supply terminal VDD, where the gate terminal of the PMOS transistor P2 is connected to the source terminal of the PMOS transistor P2. The pull-high circuit 802 is configured to control the voltage level of the gate terminal of the PMOS transistor P-SW, to prevent the PMOS transistor P-SW from being turned on under the positive ESD stress applying on the output pad 106 when a semiconductor chip including the output circuit 80 is in the power off state. The pull-low circuit 804 is coupled to the gate terminal of the NMOS transistor N-SW. The pull-low circuit 804 may be implemented with a NMOS transistor N2, which is coupled between the gate terminal of the NMOS transistor N-SW and the system ground terminal VSS, where the gate terminal of the NMOS transistor N2 is connected to the source terminal of the NMOS transistor N2. The pull-low circuit 804 is configured to control the voltage level of the gate terminal of the NMOS transistor N-SW, to prevent the NMOS transistor N-SW from being turned on under the negative ESD stress applying on the output pad 106 when the semiconductor chip is in the power off state.

In normal operations of the semiconductor chip, the signals SA and SB turn on the transistors P-SW and N-SW of the transmission gate, respectively, allowing the driving currents to pass through the transmission gate. Under a component-level ESD test, the semiconductor chip is in the power off state and thus the signals SA and SB are floating, which may not ensure that the transistors P-SW and N-SW of the transmission gate are turned off or turned on. Since there is no current limiting resistor on the output path, if any of the transistors P-SW and N-SW is turned on in the ESD test, the ESD current may easily pass through the transmission gate and enter the internal circuitry of the output buffer 102 to damage the circuit elements in the output buffer 102 or other internal circuit elements of the semiconductor chip such that the semiconductor chip may fail to pass the ESD test. In order to prevent this problem, the pull-high circuit 802 and the pull-low circuit 804 are included and coupled to the gate terminals of the PMOS transistor P-SW and the NMOS transistor N-SW, respectively. The pull-high circuit 802 and the pull-low circuit 804 ensure the transistors P-SW and N-SW to be turned off when the semiconductor chip is in the power off state. As a result, when the component-level ESD test is performed, the ESD current may not pass through the switch channel of the transmission gate. Instead, much of the ESD current is conducted to the ESD protection units (which are omitted in FIG. 8), and only little ESD current is conducted to the P-N junctions of the transistors P-SW and N-SW, where the current limiting resistors R_CLP and R_CLN protect the P-N junctions from being burnt or ruined by unlimited ESD current.

Figure 9:
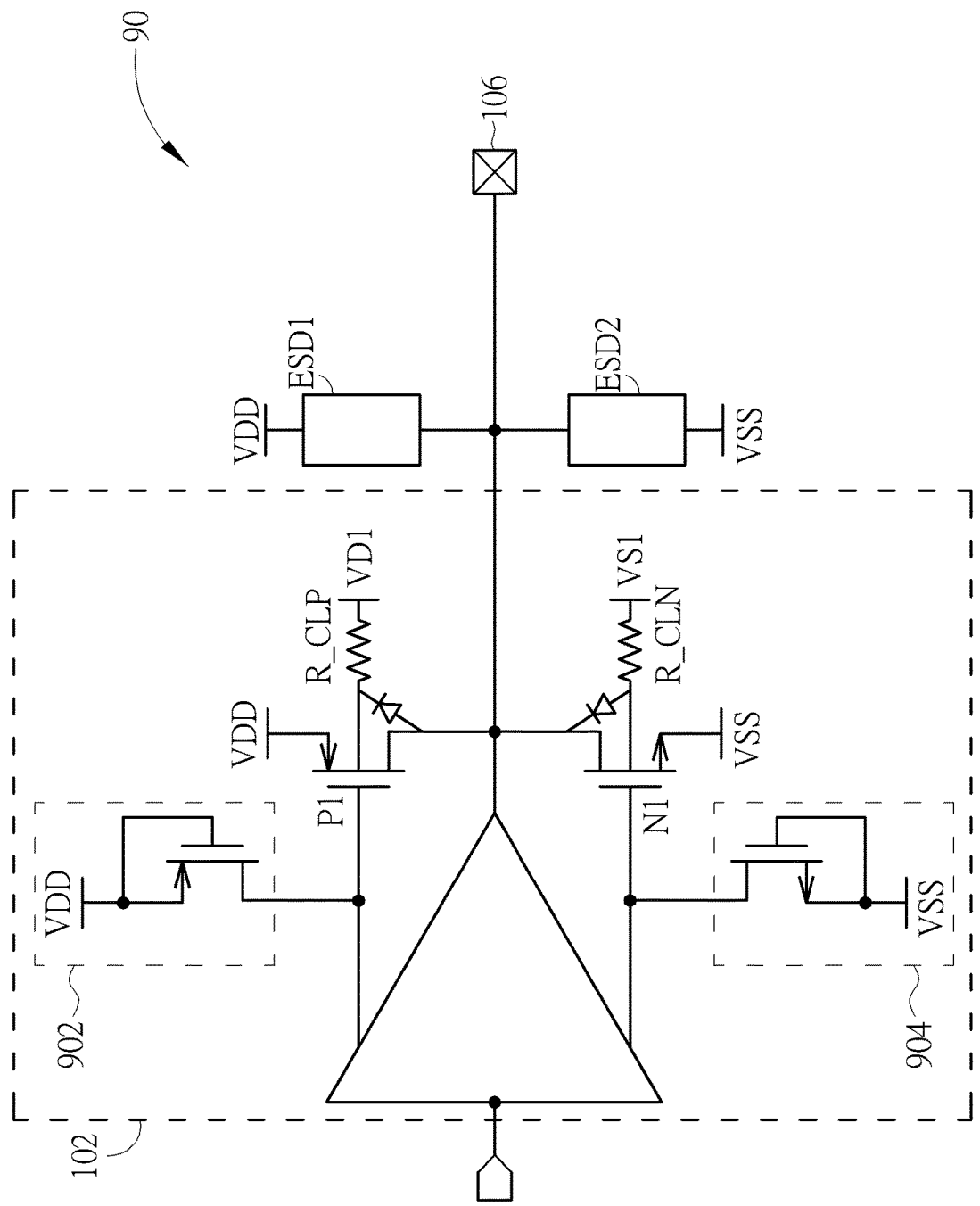
FIG. 9 is a schematic diagram of an output circuit according to an embodiment of the present invention.

Please refer to FIG. 9, which is a schematic diagram of an output circuit 90 according to an embodiment of the present invention. FIG. 9 illustrates similar pull-high and pull-low schemes for an output circuit structure where the output buffer is directly connected to the output pad without passing through the switch (i.e., transmission gate), such as the structure of the output circuit 70 shown in FIGS. 7A and 7B. In FIG. 9, the circuit elements or components are similar to those in the output circuit 70, and they are denoted by the same symbols. A pull-high circuit 902, which is coupled to the gate terminal of the PMOS transistor P1, is configured to control the voltage level of the gate terminal of the PMOS transistor P1, to prevent the PMOS transistor P1 from being turned on under the positive ESD stress applying on the output pad 106 when a semiconductor chip including the output circuit 90 is in the power off state. A pull-low circuit 904, which is coupled to the gate terminal of the NMOS transistor N1, is configured to control the voltage level of the gate terminal of the NMOS transistor N1, to prevent the NMOS transistor N1 from being turned on under the negative ESD stress applying on the output pad 106 when the semiconductor chip is in the power off state. The pull-high circuit 902 and the pull-low circuit 904 may turn off the transistors P1 and N1 when the semiconductor chip is in the power off state in the component-level ESD test, in order to prevent the ESD current from entering the internal circuitry of the output buffer 102 to damage the circuit elements in the output buffer 102 or other internal circuit elements of the semiconductor chip. The detailed operations of the pull-high circuit 902 and the pull-low circuit 904 in the output circuit 90 are similar to those of the pull-high circuit 802 and the pull-low circuit 804 in the output circuit 80, and will not be narrated herein.

To sum up, the present invention provides an output circuit for a semiconductor chip. The output circuit provides ESD protection function while preventing heat energies from raising the operating temperature in normal operations of the semiconductor chip. In the output circuit of the present invention, the current limiting resistor is coupled to the bulk terminal of a transistor coupled to the output pad of the output circuit, where the transistor may be included in an output switch (e.g., a transmission gate) or an output buffer. The current limiting resistor coupled to the bulk terminal may achieve ESD protection similar to the conventional structure where the current limiting resistor is on the output path. Since the current limiting resistor of the present invention is coupled to the bulk terminal rather than on the output path, the driving current of the data voltages may not pass through the current limiting resistor. Therefore, the driving capability of the output circuit may not be reduced by the current limiting resistor, and this achieves heat reduction because there is no power loss on the current limiting resistor in the normal operations of the semiconductor chip.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output circuit with electrostatic discharge (ESD) protection in a semiconductor chip of a source driver, the source driver configured to drive a display panel, the output circuit comprising:
   an output buffer;
   an output pad;
   a switch coupled between the output buffer and the output pad, wherein data voltages for driving the display panel are transmitted from the output buffer to the output pad via the switch, and the switch comprises a first metal oxide semiconductor (MOS) transistor, which comprises a first terminal coupled to the output pad, a bulk terminal and a gate terminal; and
   a first resistor, coupled between the bulk terminal of the first MOS transistor and a first power supply terminal, wherein the first resistor is used to realize the ESD protection.

2. The output circuit of claim 1, further comprising:
   a first pulling circuit coupled to the gate terminal of the first MOS transistor and a first system power supply terminal, and configured to control a voltage level of the gate terminal of the first MOS transistor.

3. The output circuit of claim 1, further comprising a second resistor coupled between the output pad and the first terminal of the first MOS transistor.

4. The output circuit of claim 1, wherein the switch further comprises:
   a second MOS transistor, comprising a first terminal coupled to the output pad, a bulk terminal and a gate terminal; and
   a second resistor, coupled between the bulk terminal of the second MOS transistor and a second power supply terminal.

5. The output circuit of claim 4, wherein the first MOS transistor and the second MOS transistor are a P-type metal oxide semiconductor (PMOS) transistor and an N-type metal oxide semiconductor (NMOS) transistor of a transmission gate.

6. The output circuit of claim 4, further comprising:
   a first pulling circuit coupled to the gate terminal of the first MOS transistor and a first system power supply terminal, and configured to control a voltage level of the gate terminal of the first MOS transistor; and
   a second pulling circuit coupled to the gate terminal of the second MOS transistor and a second system power supply terminal, and configured to control a voltage level of the gate terminal of the second MOS transistor.

7. The output circuit of claim 4, wherein the first resistor is configured to limit a current flowing through a P-N junction between the first terminal of the first MOS transistor and the bulk terminal of the first MOS transistor under an ESD stress of a first polarity applying on the output pad, and the second resistor is configured to limit a current flowing through a P-N junction between the first terminal of the second MOS transistor and the bulk terminal of the second MOS transistor under an ESD stress of a second polarity applying on the output pad.

8. The output circuit of claim 5, further comprising a third resistor coupled between the output pad and a terminal of the transmission gate where the first terminal of the first MOS transistor and the first terminal of the second MOS transistor are coupled.

9. The output circuit of claim 1, wherein the switch further comprises:
a second MOS transistor, comprising a first terminal and a bulk terminal; and
a second resistor, coupled between the first terminal of the second MOS transistor and the output pad.

10. The output circuit of claim 9, wherein the first MOS transistor and the second MOS transistor are a P-type metal oxide semiconductor (PMOS) transistor and an N-type metal oxide semiconductor (NMOS) transistor of a transmission gate.

11. The output circuit of claim 9, further comprising:
a first pulling circuit coupled to the gate terminal of the first MOS transistor and a first system power supply terminal, and configured to control a voltage level of the gate terminal of the first MOS transistor; and
a second pulling circuit coupled to the gate terminal of the second MOS transistor and a second system power supply terminal, and configured to control a voltage level of the gate terminal of the second MOS transistor.

12. The output circuit of claim 9, wherein the first resistor is configured to limit a current flowing through a P-N junction between the first terminal of the first MOS transistor and the bulk terminal of the first MOS transistor under an ESD stress of a first polarity applying on the output pad, and the second resistor is configured to limit a current flowing through a P-N junction between the first terminal of the second MOS transistor and the bulk terminal of the second MOS transistor under an ESD stress of a second polarity applying on the output pad.

13. The output circuit of claim 1, wherein the output pad is coupled to an ESD protection unit.

14. An output circuit with electrostatic discharge (ESD) protection in a semiconductor chip, comprising:
an output buffer, coupled to an output pad of the semiconductor chip, the output buffer comprising:
a first metal oxide semiconductor (MOS) transistor, comprising a first terminal coupled to the output pad, a bulk terminal and a gate terminal; and
a second MOS transistor, comprising a first terminal coupled to the output pad, a bulk terminal and a gate terminal; and
a first resistor, coupled between the bulk terminal of the first MOS transistor and a first power supply terminal, wherein the first resistor is used to realize the ESD protection.

15. The output circuit of claim 14, further comprising:
a second resistor, coupled between the bulk terminal of the second MOS transistor and a second power supply terminal.

16. The output circuit of claim 15, wherein the first resistor is configured to limit a current flowing through a P-N junction between the first terminal of the first MOS transistor and the bulk terminal of the first MOS transistor under an ESD stress of a first polarity applying on the output pad, and the second resistor is configured to limit a current flowing through a P-N junction between the first terminal of the second MOS transistor and the bulk terminal of the second MOS transistor under an ESD stress of a second polarity applying on the output pad.

17. The output circuit of claim 14, further comprising a third resistor coupled between the output pad and a terminal of the output buffer where the first terminal of the first MOS transistor and the first terminal of the second MOS transistor are coupled.

18. The output circuit of claim 14, wherein the first MOS transistor and the second MOS transistor are a P-type metal oxide semiconductor (PMOS) transistor and an N-type metal oxide semiconductor (NMOS) transistor of the output buffer.

19. The output circuit of claim 14, further comprising:
a first pulling circuit coupled to the gate terminal of the first MOS transistor and a first system power supply terminal, and configured to control a voltage level of the gate terminal of the first MOS transistor; and
a second pulling circuit coupled to the gate terminal of the second MOS transistor and a second system power supply terminal, and configured to control a voltage level of the gate terminal of the second MOS transistor.

20. The output circuit of claim 14, further comprising:
a second resistor, coupled between the first terminal of the second MOS transistor and the output pad.

21. The output circuit of claim 20, wherein the first resistor is configured to limit a current flowing through a P-N junction between the first terminal of the first MOS transistor and the bulk terminal of the first MOS transistor under an ESD stress of a first polarity applying on the output pad, and the second resistor is configured to limit a current flowing through a P-N junction between the first terminal of the second MOS transistor and the bulk terminal of the second MOS transistor under an ESD stress of a second polarity applying on the output pad.

22. The output circuit of claim 14, wherein the output pad is coupled to an ESD protection unit.

* * * * *